United States Patent
Schmidt (10) Patent No.: US 8,564,088 B2
(45) Date of Patent: Oct. 22, 2013

(54) SEMICONDUCTOR DEVICE HAVING VARIABLY LATERALLY DOPED ZONE WITH DECREASING CONCENTRATION FORMED IN AN EDGE REGION

(75) Inventor: Gerhard Schmidt, Wernberg-Wudmath (AT)

(73) Assignee: Infineon Technologies Austria AG, Villach (AT)

( * ) Notice: Subject to any disclaimer, the term of this patent is extended or adjusted under 35 U.S.C. 154(b) by 413 days.

(21) Appl. No.: 12/194,249

(22) Filed: Aug. 19, 2008

(65) Prior Publication Data

US 2010/0044825 A1  Feb. 25, 2010

(51) Int. Cl.
*H01L 23/58* (2006.01)
*H01L 29/78* (2006.01)

(52) U.S. Cl.
USPC ..... 257/493; 257/495; 257/496; 257/E29.012

(58) Field of Classification Search
USPC ........... 257/328, 491–494, 495, 496, E29.012
See application file for complete search history.

(56) References Cited

U.S. PATENT DOCUMENTS

| | | | | |
|---|---|---|---|---|
| 4,573,066 | A * | 2/1986 | Whight | 257/495 |
| 5,023,696 | A * | 6/1991 | Ogino | 257/612 |
| 5,552,625 | A * | 9/1996 | Murakami et al. | 257/409 |
| 6,215,168 | B1 * | 4/2001 | Brush et al. | 257/494 |
| 2005/0156284 | A1 * | 7/2005 | Schmidt | 257/626 |
| 2006/0197159 | A1 * | 9/2006 | Schmidt | 257/354 |
| 2006/0273346 | A1 * | 12/2006 | Pfirsch | 257/171 |
| 2007/0222023 | A1 * | 9/2007 | Schmidt | 257/499 |
| 2007/0272979 | A1 * | 11/2007 | Saito et al. | 257/335 |
| 2010/0052047 | A1 * | 3/2010 | Schmidt | 257/330 |
| 2010/0078756 | A1 * | 4/2010 | Schmidt | 257/499 |
| 2012/0193720 | A1 * | 8/2012 | Han et al. | 257/368 |
| 2012/0302061 | A1 * | 11/2012 | Arie et al. | 438/675 |

FOREIGN PATENT DOCUMENTS

| | | |
|---|---|---|
| DE | 10324100 | 12/2004 |
| DE | 10358985 B3 | 5/2005 |
| DE | 102005023668 | 11/2006 |
| JP | 2000-277726 | * 10/2000 |

OTHER PUBLICATIONS

S. Wolf et al., Silicon Processing for the VLSI Era, 1986, vol. 1, p. 295.*
J.A. Appels et al., "Thin Layer High-Voltage Devices", Philips J. Res., vol. 35, No. 1 (1980) pp. 1-13.
D.J. Fitzgerald et al., "Surface Recombination in Semiconductors", Surface Science, 9 (1968) pp. 347-369.

(Continued)

*Primary Examiner* — Anh Mai
(74) *Attorney, Agent, or Firm* — Dicke, Billig & Czaja, PLLC (57) ABSTRACT

In a semiconductor body, a semiconductor device has an active region with a vertical drift section of a first conduction type and a near-surface lateral well of a second, complementary conduction type. An edge region surrounding this active region comprises a variably laterally doped doping material zone (VLD zone). This VLD zone likewise has the second, complementary conduction type and adjoins the well. The concentration of doping material of the VLD zone decreases to the concentration of doping material of the drift section along the VLD zone towards a semiconductor chip edge. Between the lateral well and the VLD zone, a transitional region is provided which contains at least one zone of complementary doping located at a vertically lower point than the well in the semiconductor body.

5 Claims, 7 Drawing Sheets

(56) References Cited

OTHER PUBLICATIONS

R. Stengl et al., "Variation of Lateral Doping as a Field Terminator for High-Voltage Power Devices", IEEE Trans. Electr. Dev., vol. ED-33, No. 3 (Mar. 1986) pp. 426-428.

Temple, "Increased Avalanche Breakdown Voltage and Controlled Surface Electric Fields Using a Junction Termination Extension (JTE) Technique", IEEE Trans. Electr. Dev., vol. ED-30, No. 8 (Aug. 1983) pp. 954-957.

Lecture 5, "Ion Implantation", Reading: Chapter 5, Georgia Tech, ECE 6450—Dr. Alan Doolittle, 2005 (21 pgs.).

* cited by examiner

SEMICONDUCTOR DEVICE HAVING VARIABLY LATERALLY DOPED ZONE WITH DECREASING CONCENTRATION FORMED IN AN EDGE REGION

BACKGROUND

To obtain a sufficiently high blocking capability in power semiconductor devices made from Si or SiC, suitable measures for the control of the high electric field strength in the edge region are required. At the points where the blocking p-n junctions come to the surface, unfavourable dimensioning can result to a very early onset of avalanche generation, which can reduce the blocking capability of the device to well below the value of bulk breakthrough voltage.

For these and other reasons, there is a need for the present invention.

SUMMARY

In one embodiment, a semiconductor device includes a semiconductor body with an active region with a vertical drift section of a first conduction type and with a near-surface lateral well of a second, complementary conduction type. An edge region surrounding this active region includes a variably laterally doped doping material zone (VLD zone). This VLD zone likewise has the second, complementary conduction type and adjoins the well. The concentration of doping material of the VLD zone decreases to the concentration of doping material of the drift section along the VLD zone towards a semiconductor chip edge. In a transitional region from the lateral well to the VLD zone, at least one zone with complementary doping is provided, which is located at a vertically lower point than the well in the semiconductor body.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
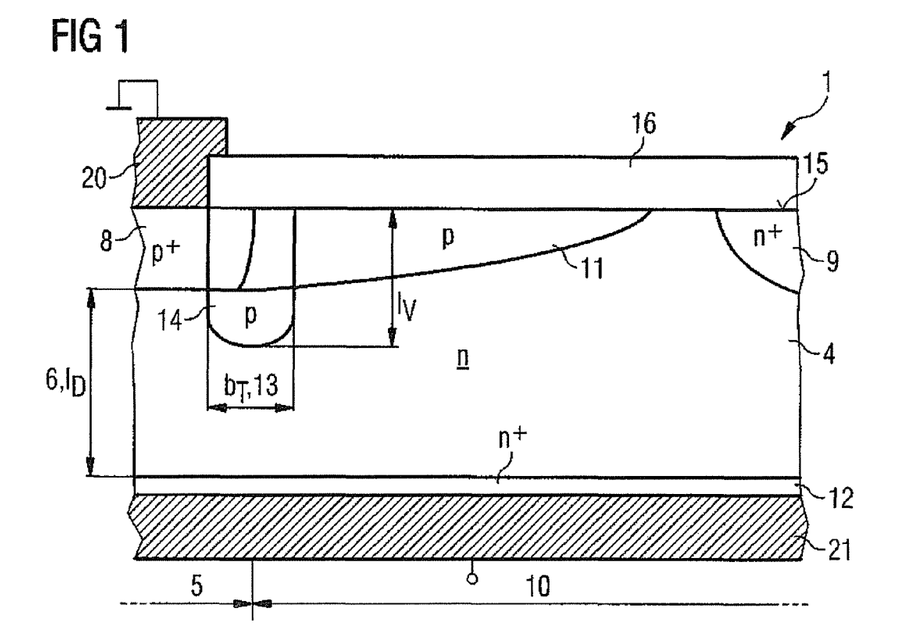
FIG. 1 illustrates a diagrammatic cross-section through a section of a semiconductor device.

FIG. 1 illustrates a diagrammatic cross-section through a section of a semiconductor device 1. In this embodiment, the semiconductor device 1 includes a semiconductor body 4 with a front side 15 forming a first surface. The semiconductor body 4 has an active region 5 with a vertical drift section 6 of a first conduction type, which in the present embodiment is an n-type, and with a near-surface lateral well 8 of a second, complementary conduction type, which in the present embodiment is a $p^+$-type. The lateral well 8 is located close to the front side 15 of the semiconductor body 4. An edge region 10 surrounding the active region 5 includes a variably laterally doped doping material zone 11 hereinafter referred to as VLD zone. This VLD zone 11 likewise has the second, complementary conduction type and adjoins the lateral well 8. The concentration of doping material of the VLD zone 11 decreases to the concentration of doping material of the drift section 6 along the VLD zone 11 towards a semiconductor chip edge. At the boundary between the lateral well 8 and the VLD zone 11, at least one zone 14 with complementary doping is provided in a transitional region 13, which zone is located in the semiconductor body 4 and vertically lower than the lateral well 8 with respect to the front side 15. In the illustrated embodiment, a p-doped zone 14 is provided.

In an embodiment not shown in FIG. 1, the first conduction type is a p-type and the second conduction type is an n-type.

The vertical drift section 6 is adjoined by a layer 12 with a concentration of doping material of the first conduction type which is higher than that of the drift section 6 and in the present case is an $n^+$-type. This reduces the contact resistance to an electrode 21, which in the present case is a cathode.

In the edge region 10, the semiconductor device includes, in a near-surface region of the front side 15 towards the semiconductor chip edge, a region 9 of the first conduction type, this region 9 being doped more highly than the drift section 6. The region 9 illustrated in FIG. 1 is $n^+$-doped. This region 9 therefore serves as a channel stopper to limit the depletion region at the outer edge of the semiconductor device 1 when the p-n junction is reverse-biased.

The zone 14 with complementary doping may be so arranged in the transitional region 13 between the lateral well 8 and the VLD zone 11 that it projects more deeply into the semiconductor body 4 than the well 8 of the complementary conduction type from the front side 15 of the semiconductor body 4.

The zone 14 of complementary doping may, in the transitional region 13, further have a doping material dose $D_T$ which is less than the breakthrough charge $D_S$ of the semiconductor body 4, lying in the range of $0.005\,D_S \leq D_T \leq 0.8\,D_S$.

In some embodiments, the zone 14 of complementary doping has a concentration of doping material which decreases in the lateral direction from the active region 5 towards the edge region 10.

In some embodiments, the zone 14 of complementary doping has a concentration of doping material which decreases in the vertical direction from the front side 15 of the semiconductor 4 towards a side opposite the front side 15.

For the vertical depth $I_V$ of the zone 14 of complementary doping, measured from the front side 15 of the semiconductor body 4 and related to the vertical length $I_D$ of the drift section 6, a range of $0.05 \leq I_V/I_D \leq 0.95$ is provided, for example.

The ratio of the lateral width $b_T$ of the zone 14 of complementary doping and the vertical length $I_D$ of the drift section 6 may typically lie in the range of $0.05 \leq b_T/I_D \leq 0.2$ in some embodiments.

It is further possible to have the zone 14 of complementary doping contact both the well 8 and the VLD zone 11.

The edge region 10 of the semiconductor device 1 may be covered by a semi-insulating passivation layer 16 in some embodiments. This semi-insulating passivation layer 16 includes a diamond-like carbon layer (DLC layer) or an amorphous hydrogenated silicon carbide layer.

The semiconductor device 1 is, for example, a high-voltage power semiconductor device with a diode structure without compensation zones. For this purpose, the semiconductor device 1 includes an anode 20 and a cathode 21.

In some embodiments, the semiconductor device 1 is a high-voltage power semiconductor device with an IGBT structure without compensation zones or an HVDC thyristor structure in the active region 5.

In some embodiments, the semiconductor device 1 is a high-voltage power semiconductor device with a MOSFET structure with vertical compensation zones in the active region 5.

Figure 2:
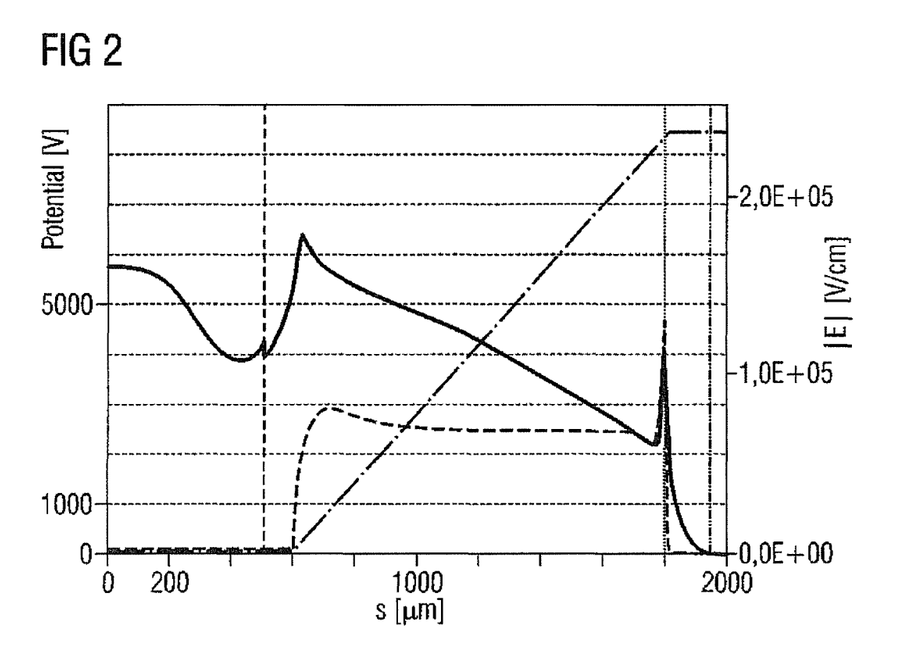
FIG. 2 illustrates diagrams of the lateral field strength and potential behaviour of a semiconductor device according to FIG. 1.

FIG. 2 illustrates diagrams of the lateral field strength and potential behaviour of a semiconductor device 1 according to FIG. 1. The lateral dimension of the semiconductor device 1 is plotted on the abscissa. On the left-hand ordinate in FIG. 2, the potential is plotted, while the right-hand ordinate indicates the absolute value of the electric field strength, both variables having been determined by simulation. The transitional region 13 between the lateral well 8 and the VLD zone 11 is indicated by the broken vertical line in FIG. 2, extending 100 μm to the left and to the right of this line. The position of the transition between the VLD zone 11 and the drift section 6 in the lateral direction is indicated by the dotted vertical line. The region 9 located in the edge region 10 of the semiconductor device 1 in a near-surface region of the front side 15 towards the semiconductor chip edge and serving as a channel stopper is located in the section indicated by the dot-dash vertical line.

As FIG. 2 illustrates, the potential on the front side 15 of the semiconductor body 4, which is indicated by a dot-dash line, remains linear until the blocking voltage value is reached at the lateral transition from the VLD zone 11 to the drift section 6. The potential curve in the semi-insulating passivation layer 16, which is not shown in FIG. 2, is virtually identical to the potential distribution on the front side 15 of the semiconductor body 4.

The continuous line in FIG. 2 indicates the behaviour of the electric field strength at the transition between the well 8 or the VLD zone 11 respectively and the drift section 6, while the broken line indicates the behaviour of the electric field strength on the front side 15 of the semiconductor body 4.

The blocking voltage of the semiconductor device 1 is determined by the maximum value of the electric field strength, which is found at the transition between the near-surface lateral well 8 and the VLD zone 11. By introducing a zone 14 of complementary doping, the field conditions are optimized and high blocking voltages are obtained. Using these optimization measures, the blocking capability can be increased up to the bulk breakthrough voltage.

A further feature of the illustrated embodiment is the increased robustness of the semiconductor device 1 in terms of cosmic radiation failure both on the front side 15 and in the volume of the semiconductor body 4, which is achieved by optimizing the field distribution.

The embodiment according to FIG. 1 is a diode dimensioned for use with 6.5 kV. The disclosed device is however suitable for any voltage classes and device types. The concept is applicable in semiconductor devices requiring a maximum blocking capability in the edge region, for example in an IGBT with dynamic clamping strength or in HVDC thyristors (high-voltage DC thyristors) with integrated voltage transient protection.

As a result of the constant surface field strength illustrated in FIG. 2, the edge width of the semiconductor device 1 can be minimized. This may be useful in small devices, where more than 50 percent of chip area is presently required for edge termination.

Figure 3:
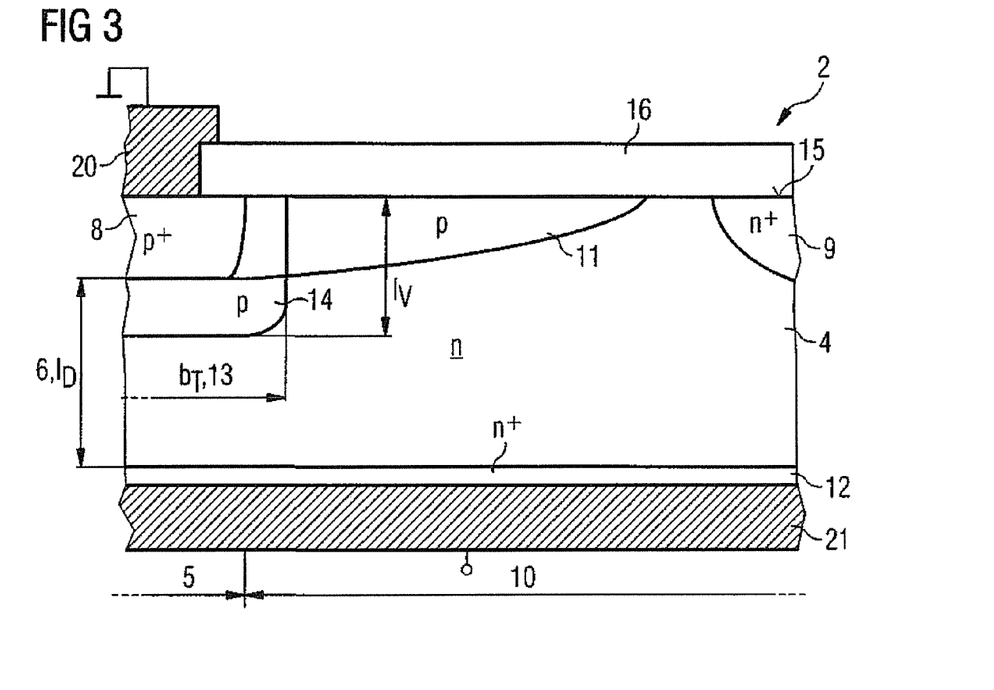
FIG. 3 illustrates a diagrammatic cross-section through a section of a semiconductor device.

FIG. 3 illustrates a diagrammatic cross-section through a section of a semiconductor device 2. Components of identical function as those in FIG. 1 are identified by the same reference numbers and not explained again in the following description.

The zone 14 of complementary doping extends over the entire region of the near-surface lateral well 8 in the illustrated embodiment. The zone 14 of complementary doping is doped more lightly than the near-surface lateral well 8, which is reflected in the p-doping of the zone 14 in contrast to a $p^+$-doping of the well 8.

If the zone 14 extends over the entire region of the well 8, the electric field is weakened in the one-dimensional region at the base of the well 8. This results in an improvement of the cosmic radiation resistance of the semiconductor device 2.

The zone 14 of complementary doping may be so located in the transitional region 13 that it projects more deeply into the semiconductor body 4 than the well 8 of the complementary conduction type with respect to the front side 15 of the semiconductor body 4.

As explained above, the zone 14 of complementary doping may have a doping material dose $D_T$ which is less than the breakthrough charge $D_S$ of the surrounding semiconductor body 4, lying in the range of $0.005\ D_S \leq D_T \leq 0.8\ D_S$, for example.

It is further provided that the vertical depth $I_V$ of the zone 14 of the complementary doping, related to the vertical length $I_D$ of the drift section 6, lies in a range of $0.05 \leq I_V/I_D \leq 0.95$ in some embodiments.

In addition, the ratio of the lateral width $b_T$ of the zone 14 of complementary doping and the vertical length $I_D$ of the drift section 6 may lie in the range of $0.05 \leq b_T/I_D \leq 0.2$ as in the semiconductor device 1 described above.

The edge region 10 of the semiconductor device 2 may further be covered by a semi-insulating passivation layer 16. This passivation layer 16 includes a diamond-like carbon layer (DLC layer) or an amorphous hydrogenated silicon carbide layer in some embodiments.

In some embodiments, the zone 14 of complementary doping has a concentration of doping material which decreases in the lateral direction from the active region 5 towards the edge region 10.

In some embodiments, the zone 14 of complementary doping has a concentration of doping material which decreases in the vertical direction from the front side 15 of the semiconductor 4 towards a side opposite the front side 15.

It is further possible to have the zone 14 of complementary doping contact both the well 8 and the VLD zone 11.

The semiconductor device 2 illustrated in FIG. 3 is a high-voltage power semiconductor device with a diode structure without compensation zones. For this purpose, the semiconductor device 2 includes an anode 20 and a cathode 21.

In some embodiments, the semiconductor device 2 is a high-voltage power semiconductor device with an IGBT structure without compensation zones or an HVDC thyristor structure in the active region 5.

In some embodiments, the semiconductor device 2 is a high-voltage power semiconductor device with a MOSFET structure with vertical compensation zones in the active region 5.

Owing to the zone 14 of complementary doping, which is introduced into the transitional region 13, the semiconductor device 2 is characterised by a high blocking capability as explained for the semiconductor device 1 with reference to the field strength and potential behaviour plotted in FIG. 2. It therefore has the same properties as the semiconductor device 1, which are not described again to avoid repetition.

Figure 4:
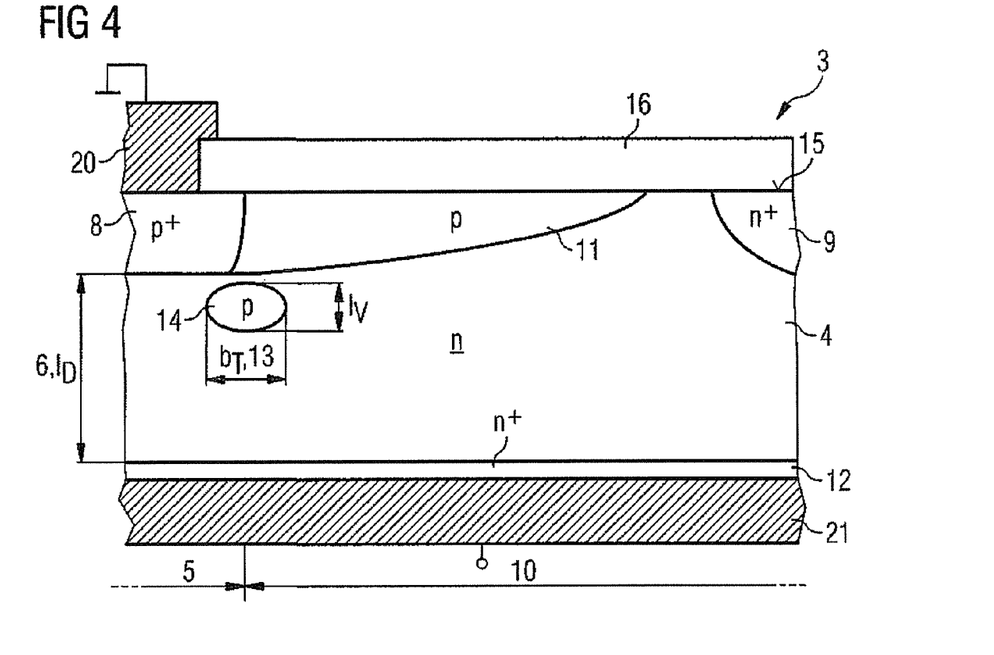
FIG. 4 illustrates a diagrammatic cross-section through a section of a semiconductor device.

FIG. 4 illustrates a diagrammatic cross-section through a section of a semiconductor device 3. Components of identical function as those in FIGS. 1 and 3 are identified by the same reference numbers and not explained again in the following description.

This device differs from the semiconductor devices 1 and 2 in that the zone 14 of complementary doping is located below the transitional region 13 in the semiconductor body 4 and in contact neither with the well 8 nor with the VLD zone 11. The zone 14 of complementary doping is therefore floating in the semiconductor body 4 in this embodiment.

As described above, the floating zone 14 of complementary doping may have a doping material dose $D_T$ which is less than the breakthrough charge $D_S$ of the surrounding semiconductor body 4, lying in the range of $0.005\ D_S \leq D_T \leq 0.8\ D_S$, for example.

It is further provided that the vertical depth $I_V$ of the floating zone 14 of complementary doping, related to the vertical length $I_D$ of the drift section 6, lies in a range of $0.05 \leq I_V/I_D \leq 0.95$ in some embodiments.

In addition, the ratio of the lateral width $b_T$ of the floating zone 14 of complementary doping and the vertical length $I_D$ of the drift section 6 may lie in the range of $0.05 \leq b_T/I_D \leq 0.2$ as in the semiconductor devices 1 and 2 described above.

The edge region 10 of the semiconductor device 3 may further be covered by a semi-insulating passivation layer 16. This passivation layer 16 includes a diamond-like carbon layer (DLC layer) or an amorphous hydrogenated silicon carbide layer.

Figure 5:
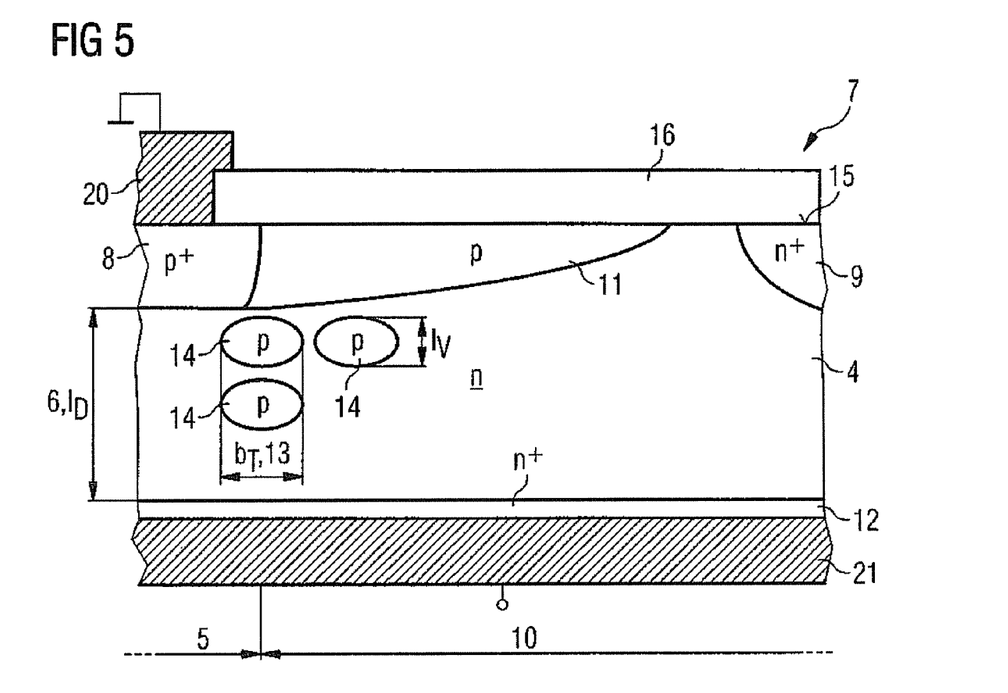
FIG. 5 illustrates a diagrammatic cross-section through a section of a semiconductor device.

FIG. 5 illustrates a diagrammatic cross-section through a section of a semiconductor device 7. Components of identical function as those in FIGS. 1, 3 and 4 are identified by the same reference numbers and not explained again in the following description.

In addition to the floating zone 14 of complementary doping provided in the semiconductor device 3, the semiconductor device 7 includes further floating zones 14 of complementary doping.

It is possible to arrange at least two floating zones 14 of complementary doping adjacent or below one another below the transitional region 13.

In some embodiments, the semiconductor devices 3 and 7 respectively can be modified such that the zones 14 of complementary doping have a concentration of doping material which decreases in the lateral direction from the active region 5 towards the edge region 10. For this purpose, the semiconductor devices 3 and 7 respectively include at least three floating zones 14 of complementary doping, which are arranged adjacent to one another below the transitional region 13, the distance between two adjacent zones 14 increasing in the lateral direction from the active region 5 towards the edge region 10.

In embodiments of the semiconductor devices 3 and 7 respectively, the zones 14 of complementary doping have a concentration of doping material which decreases in the vertical direction from the front side 15 of the semiconductor body 4 towards a side opposite the front side 15. For this purpose, at least three floating zones 14 of complementary doping are arranged below one another below the transitional region 13, the distance between two adjacent zones 14 increasing in the vertical direction from the front side 15 of the semiconductor body 4 towards a side opposite the front side 15.

It is further possible to provide at least two first floating zones 14 of complementary doping adjacent to one another below the transitional region 13 and at least one third floating zone 14 of complementary doping below the first zones 14.

The semiconductor device 3 and 7 shown in FIGS. 4 and 5 are high-voltage power semiconductor devices with a diode structure without compensation zones.

In some embodiments, the semiconductor devices 3 and 7 are high-voltage power semiconductor devices with a MOSFET structure with vertical compensation zones in the active region 5.

The semiconductor device 3 illustrated in FIG. 4 and the semiconductor device 7 illustrated in FIG. 5 have a high blocking capability owing to the at least one zone 14 of complementary doping introduced into the transitional region 13 between the lateral well 8 and the VLD zone 11, as explained above for the semiconductor device 1 with reference to the field strength and potential behaviour illustrated in FIG. 2. They therefore have the same properties as the semiconductor device 1, which are not described again to avoid repetition.

Figure 6A:
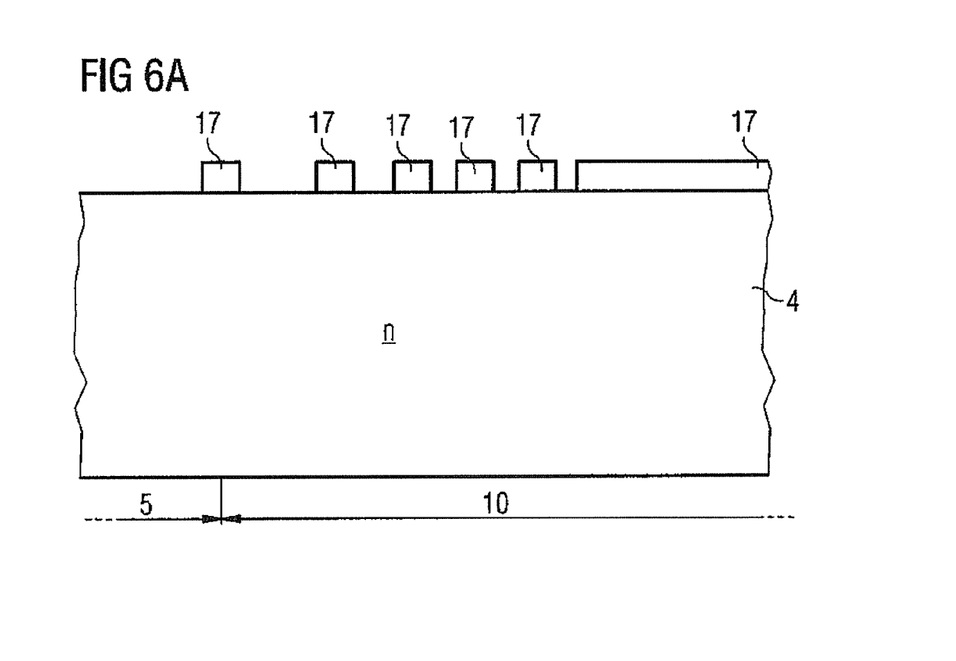
FIGS. 6A to 6E illustrate a method for the production of the edge region of a semiconductor device according to FIG. 1.

FIGS. 6A to 6E illustrate an example of a method for the production of the edge region 10 of a semiconductor device 1 according to FIG. 1. FIG. 6A illustrates a semiconductor wafer with a semiconductor body 4 of a first conduction type, which is an n-type in the illustrated embodiment. A photoresist mask 17 is applied to the front side 15 of the semiconductor body 4, which covers the edge region 10 while leaving the active region 5 exposed. This facilitates the later installation of a well 8 of a complementary conduction type into the semiconductor body 4 in the transitional region 13 towards the edge region 10. The photoresist mask 17 has hole structures for the VLD zone 11, which are arranged more densely towards the active region 5 than towards the chip edge.

Figure 6B:
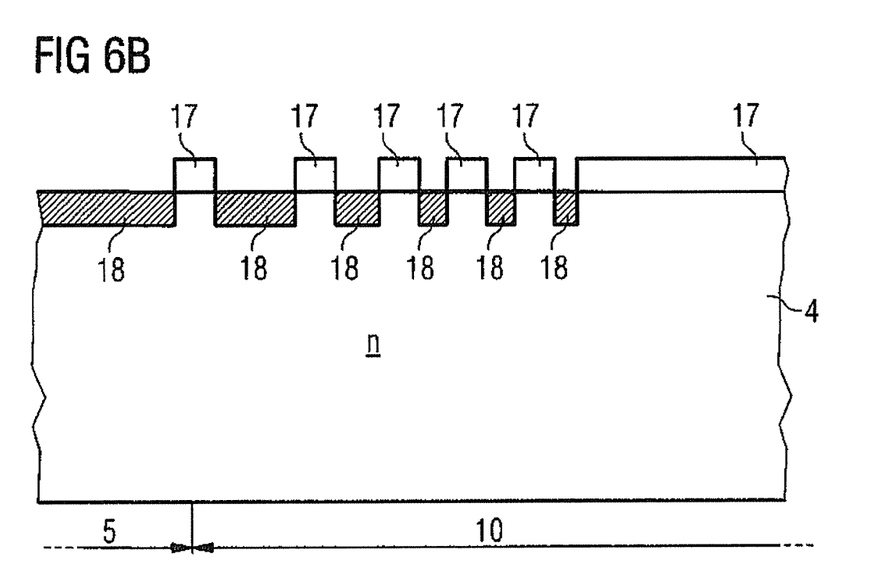

This is followed by an ion implantation of a second conduction type complementing the first conduction type, this being a p-type in the illustrated embodiment, into the semiconductor surface, accompanied by the formation of islands of doping material 18 below the hole structures of the photoresist mask 17 as illustrated in FIG. 6B.

Figure 6C:
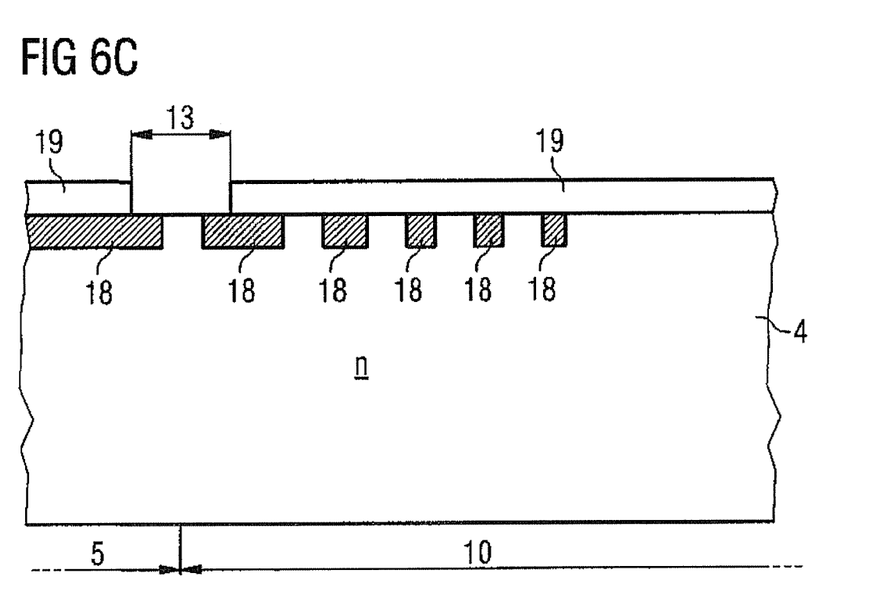

In a further process, the photoresist mask 17 is removed and a second photoresist mask 19 is applied to the front side 15 of the semiconductor body 4, wherein the transitional region 13 between the well and the VLD zone is exposed as illustrated in FIG. 6C.

Figure 6D:
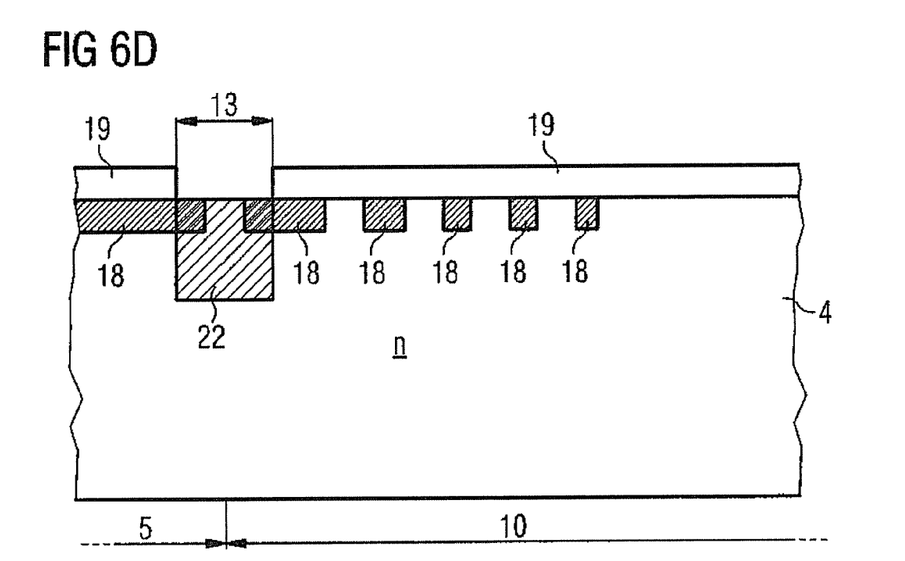

The next process is an ion implantation of a doping material of a complementary conduction type, in the present case a p-type doping material, in the transitional region 13 with a higher ion beam energy than in the formation of the well. In this process, islands of doping material 22 are formed in the transitional region 13; these project more deeply into the semiconductor body 4 than the islands 18 formed in the first ion implantation process, as illustrated in FIG. 6D.

Figure 6E:
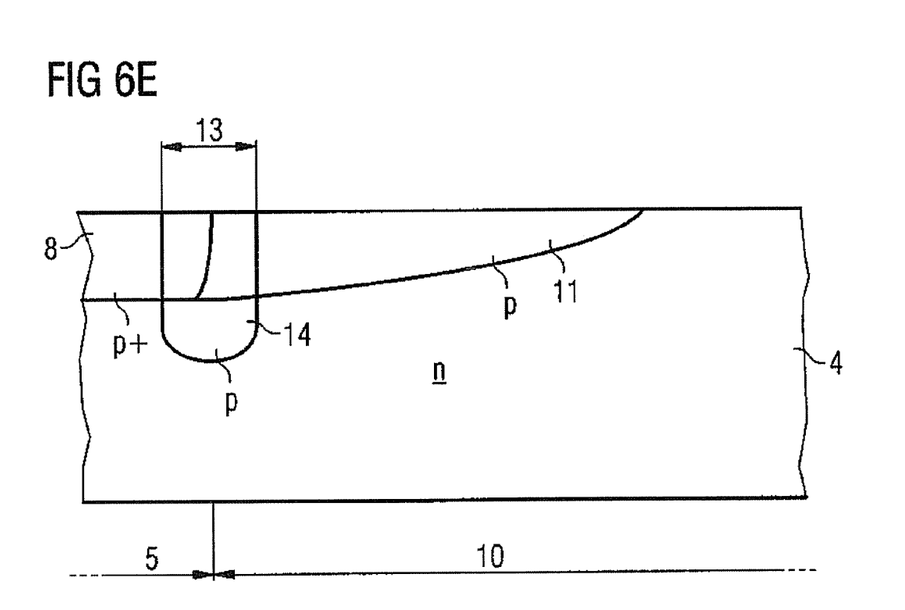

The photoresist mask 19 is then removed, and the complementary doping material is diffused to a well 8 of the complementary conduction type in the active region 5, a VLD zone 11 in the edge region 10 and a zone 14 of complementary doping extending vertically more deeply into the semiconductor body 4 than the well 8. The edge structure of the semiconductor body 4 obtained in this way is illustrated in FIG. 6E. The zone 14 of complementary doping can be produced in the transitional region 13 between the lateral well 8 and the VLD zone 11 by aluminium implantation followed by aluminium diffusion.

To produce a semiconductor device 2 according to FIG. 3, the second photoresist mask 19 illustrated in FIG. 6C is applied to the front side 15 of the semiconductor body 4 such that the transitional region 13 extends over the entire region of the well 8. All the other processes can remain the same.

Figure 7A:
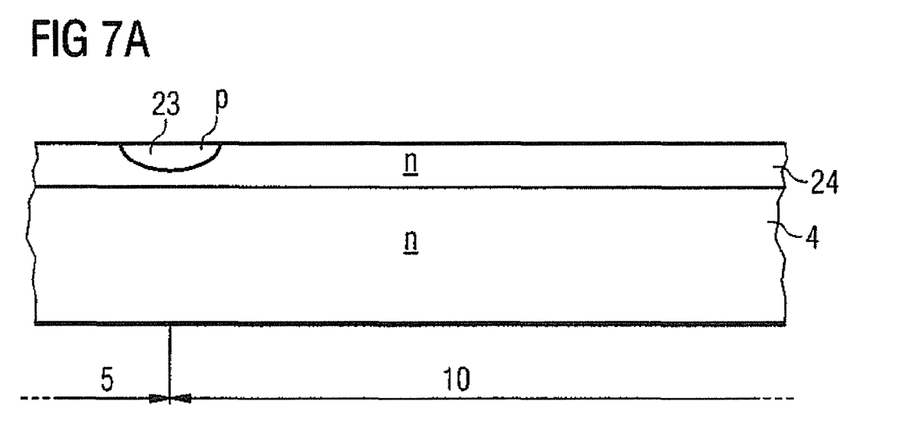
FIGS. 7A to 7D illustrate a method for the production of the edge region of a semiconductor device according to FIG. 4.

FIGS. 7A to 7D illustrate an example of a method for the production of the edge region 10 of a semiconductor device 3 according to FIG. 4. FIG. 7A illustrates the local doping of an individual epitaxial layer 24 of a semiconductor body 4 produced using multi-epitaxial technology, which in the present case is represented by local p-doping within the otherwise n-doped epitaxial layer 24 in a region 23.

Figure 7B:
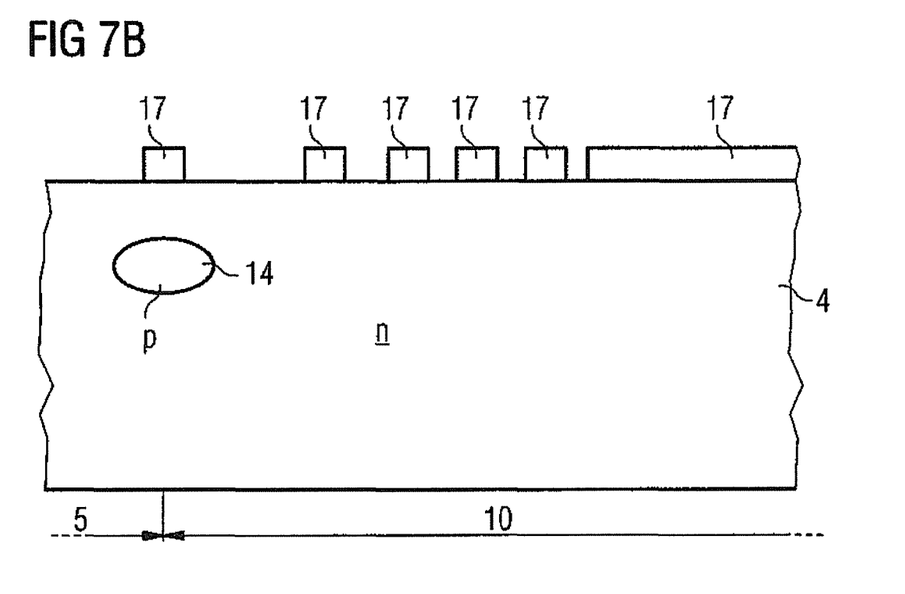

Further epitaxial layers are then applied to complete the semiconductor body 4. This results in a low-lying floating zone 14 of complementary doping in the semiconductor body 4 as illustrated in FIG. 7B. In a next process step, a photoresist mask 17 is applied to cover the edge region 10 while leaving the active region 5 exposed. The photoresist mask 17 has hole structures for the VLD zone 11, which are arranged more densely towards the active region 5 than towards the chip edge.

Figure 7C:
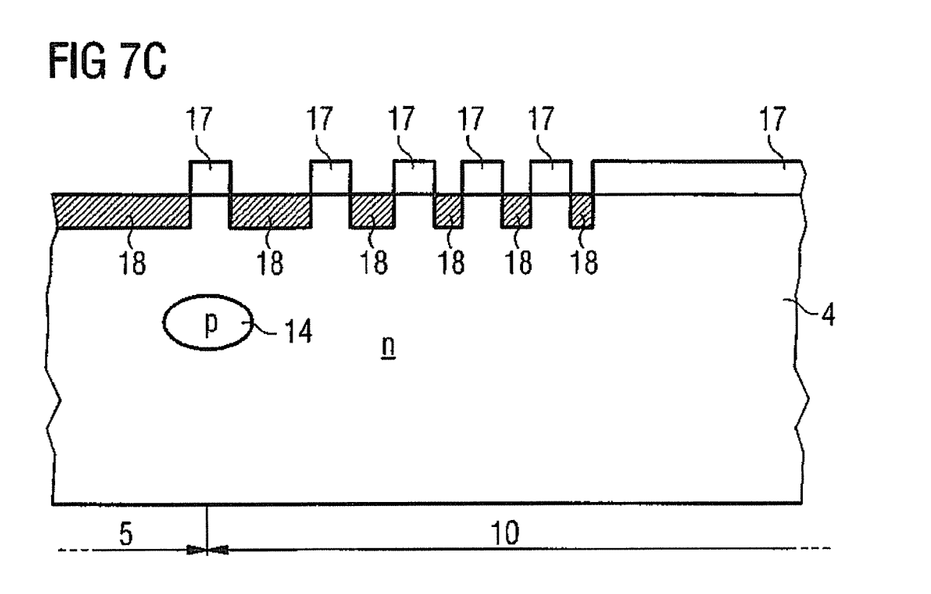

This is followed by an ion implantation of a second conduction type complementing the first conduction type, this being a p-type in the illustrated embodiment, into the semiconductor surface, accompanied by the formation of islands of doping material 18 below the hole structures of the photoresist mask 17 as illustrated in FIG. 7C.

Figure 7D:
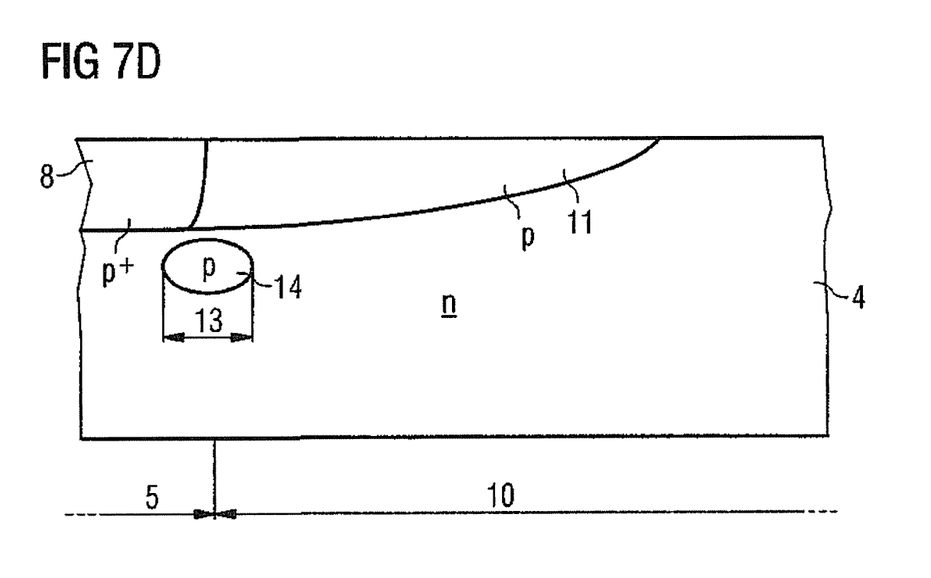

In a further process step, the photoresist mask 17 is removed, and the complementary doping material is diffused to a well 8 of a complementary conduction type in the active region 5 and to a VLD zone 11 in the edge region 10. The edge structure of the semiconductor body 4 obtained in this way, with a low-lying floating zone 14 of complementary doping below the transitional region 13 between the lateral well 8 and the VLD zone 11, is illustrated in FIG. 7D.

The method described above is suitable for semiconductor devices with compensation zones as well.

The method according to FIGS. 7A to 7D can moreover, in order to produce a semiconductor device 7 according to FIG. 5, be modified such that at least two adjacent regions 23 within an epitaxial layer located above the epitaxial layer 24 can be provided with local p-doping. In addition, further epitaxial layers can be p-doped locally, thereby introducing further floating layers 14 of complementary doping into the semiconductor body 4. By reducing the distance between adjacent zones 14 in the lateral direction from the active region 5 towards the edge region 10 and in the vertical direction from the front side 15 of the semiconductor body 4 towards a side opposite the front side 15, respectively, a concentration of doping material can be obtained in the floating zones 14 which decreases in the lateral and in the vertical direction, respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device with a semiconductor body, comprising:
    an active region with a vertical drift section of a first conduction type and with a near-surface lateral well of a second, complementary conduction type;
    an edge region surrounding the active region with a variably laterally doped doping material zone (VLD zone) of the second conduction type, which adjoins the lateral well and the concentration of doping material of which decreases to the concentration of doping material of the drift section along the VLD zone towards a semiconductor chip edge; and
    wherein at least one zone of complementary doping, which is located in the semiconductor body at a vertically lower point than the lateral well, is provided in a transitional region below a boundary between the lateral well to the VLD zone, and wherein the zone of complementary doping projects from a front sided surface of the semiconductor body more deeply into the semiconductor body than the lateral well of the complementary conduction type;
    wherein the zone of complementary doping has a doping material dose $D_T$ in the transitional region which is less than the breakthrough charge $D_S$ of the semiconductor body, lying in the range of $0.005\ D_S \leq D_T \leq 0.8\ D_S$.

2. The semiconductor device of claim 1, wherein the zone of complementary doping has, from the front side of the semiconductor body, a vertical depth $I_V$ related to the vertical length $I_D$ of the drift section which lies in a range of $0.05 \leq I_V/I_D \leq 0.95$.

3. The semiconductor device of claim 1, wherein the ratio of the lateral width $b_T$ of the zone of the complementary doping and the vertical length $I_D$ of the drift section lies in the range of $0.05 \leq b_T/I_D \leq 0.2$.

4. The semiconductor device of claim 1, wherein the zone of complementary doping contacts both the well and the VLD zone.

5. The semiconductor device of claim 1, wherein the edge region is covered by a semi-insulating passivation layer comprising a diamond-like carbon layer (DLC layer) or an amorphous hydrogenated silicon carbide layer.

* * * * *